United States Patent
Chang et al.

(10) Patent No.: US 10,163,756 B2
(45) Date of Patent: Dec. 25, 2018

(54) ISOLATION STRUCTURE FOR STACKED DIES

(71) Applicant: Taiwan Semiconductor Manufacturing Company, Ltd., Hsin-Chu (TW)

(72) Inventors: Hung-Pin Chang, Taipei (TW); Kuo-Ching Hsu, Chung-Ho (TW); Chen-Shien Chen, Zhubei (TW); Wen-Chih Chiou, Zhunan Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/254,597

(22) Filed: Apr. 16, 2014

(65) Prior Publication Data
US 2014/0225277 A1   Aug. 14, 2014

Related U.S. Application Data

(62) Division of application No. 12/348,622, filed on Jan. 5, 2009, now abandoned.

(51) Int. Cl.
*H01L 23/04* (2006.01)
*H01L 23/48* (2006.01)
(Continued)

(52) U.S. Cl.
CPC ........ *H01L 23/481* (2013.01); *H01L 21/6835* (2013.01); *H01L 24/11* (2013.01);
(Continued)

(58) Field of Classification Search
CPC ....... H01L 25/0657; H01L 2924/15311; H01L 23/051; H01L 24/72; H01L 2924/01079;
(Continued)

(56) References Cited

U.S. PATENT DOCUMENTS 5,391,917 A   2/1995  Gilmour et al.
5,426,072 A   6/1995  Finnila
(Continued)

FOREIGN PATENT DOCUMENTS

CN   101752336 A   6/2010
JP   2009004730 A   1/2009
(Continued)

OTHER PUBLICATIONS

Ranganathan, N., et al., "Integration of High Aspect Ratio Tapered Silicon Via for Through-Silicon Interconnection," 2008 Electronic Components and Technology Conference, 2008, pp. 859-865.

*Primary Examiner* — Lex Malsawma
*Assistant Examiner* — Eric W Jones
(74) *Attorney, Agent, or Firm* — Slater Matsil, LLP

(57) ABSTRACT

An isolation structure for stacked dies is provided. A through-silicon via is formed in a semiconductor substrate. A backside of the semiconductor substrate is thinned to expose the through-silicon via. An isolation film is formed over the backside of the semiconductor substrate and the exposed portion of the through-silicon via. The isolation film is thinned to re-expose the through-silicon via, and conductive elements are formed on the through-silicon via. The conductive element may be, for example, a solder ball or a conductive pad. The conductive pad may be formed by depositing a seed layer and an overlying mask layer. The conductive pad is formed on the exposed seed layer. Thereafter, the mask layer and the unused seed layer may be removed.

21 Claims, 21 Drawing Sheets

(51) Int. Cl.
*H01L 21/683* (2006.01)
*H01L 23/00* (2006.01)

(52) U.S. Cl.
CPC ............ *H01L 24/13* (2013.01); *H01L 24/14* (2013.01); *H01L 2221/6834* (2013.01); *H01L 2224/03912* (2013.01); *H01L 2224/0401* (2013.01); *H01L 2224/05009* (2013.01); *H01L 2224/05558* (2013.01); *H01L 2224/1147* (2013.01); *H01L 2224/13009* (2013.01); *H01L 2224/13025* (2013.01); *H01L 2924/00013* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01019* (2013.01); *H01L 2924/01022* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01327* (2013.01); *H01L 2924/04953* (2013.01); *H01L 2924/12042* (2013.01); *H01L 2924/14* (2013.01); *H01L 2924/15788* (2013.01); *H01L 2924/19041* (2013.01); *H01L 2924/19043* (2013.01)

(58) Field of Classification Search
CPC ............ H01L 2924/14; H01L 23/481; H01L 21/6535; H01L 24/11
USPC .................. 257/684–734; 438/458, 597, 107
See application file for complete search history.

(56) References Cited

U.S. PATENT DOCUMENTS

| | | | |
|---|---|---|---|
| 5,510,298 A | 4/1996 | Redwine | |
| 5,618,752 A * | 4/1997 | Gaul .................. | H01L 21/743 257/E21.538 |
| 5,646,067 A * | 7/1997 | Gaul ............................ | 438/458 |
| 5,767,001 A | 6/1998 | Bertagnolli et al. | |
| 5,998,292 A | 12/1999 | Black et al. | |
| 6,034,436 A | 3/2000 | Iwasaki | |
| 6,184,060 B1 | 2/2001 | Siniaguine | |
| 6,322,903 B1 | 11/2001 | Siniaguine et al. | |
| 6,417,087 B1 | 7/2002 | Chittipeddi et al. | |
| 6,448,168 B1 | 9/2002 | Rao et al. | |
| 6,451,684 B1 | 9/2002 | Kim et al. | |
| 6,465,892 B1 | 10/2002 | Suga | |
| 6,472,293 B1 | 10/2002 | Suga | |
| 6,498,381 B2 | 12/2002 | Halahan et al. | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,734,084 B1 * | 5/2004 | Nemoto ............ | H01L 21/76898 257/E21.597 |
| 6,740,582 B2 | 5/2004 | Siniaguine | |
| 6,764,950 B2 | 7/2004 | Noguchi et al. | |
| 6,770,528 B2 | 8/2004 | Furukawa et al. | |
| 6,800,930 B2 | 10/2004 | Jackson et al. | |
| 6,838,774 B2 | 1/2005 | Patti | |
| 6,841,883 B1 | 1/2005 | Farnworth et al. | |
| 6,873,054 B2 | 3/2005 | Miyazawa et al. | |
| 6,875,672 B2 * | 4/2005 | Nemoto ............ | H01L 21/6835 257/E21.597 |
| 6,882,030 B2 | 4/2005 | Siniaguine | |
| 6,897,125 B2 | 5/2005 | Morrow et al. | |
| 6,908,856 B2 | 6/2005 | Beyne et al. | |
| 6,914,336 B2 | 7/2005 | Matsuki et al. | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,015,581 B2 | 3/2006 | Casey et al. | |
| 7,030,481 B2 | 4/2006 | Savastiouk et al. | |
| 7,049,170 B2 | 5/2006 | Savastiouk et al. | |
| 7,053,465 B2 | 5/2006 | Benaissa et al. | |
| 7,060,601 B2 | 6/2006 | Savastiouk et al. | |
| 7,071,546 B2 | 7/2006 | Fey et al. | |
| 7,111,149 B2 | 9/2006 | Ellert | |
| 7,122,912 B2 | 10/2006 | Matsui | |
| 7,157,787 B2 | 1/2007 | Kim et al. | |
| 7,186,343 B2 | 3/2007 | Rabie et al. | |
| 7,186,643 B2 | 3/2007 | Ahn et al. | |
| 7,193,308 B2 | 3/2007 | Matsui | |
| 7,224,063 B2 | 5/2007 | Agarwala et al. | |
| 7,262,495 B2 | 8/2007 | Chen et al. | |
| 7,297,574 B2 | 11/2007 | Thomas et al. | |
| 7,300,857 B2 | 11/2007 | Akram et al. | |
| 7,335,972 B2 | 2/2008 | Chanchani | |
| 7,354,798 B2 | 4/2008 | Pogge et al. | |
| 7,355,273 B2 | 4/2008 | Jackson et al. | |
| 7,358,180 B2 | 4/2008 | Sakai et al. | |
| 7,514,775 B2 | 4/2009 | Chao et al. | |
| 7,528,068 B2 | 5/2009 | Soejima et al. | |
| 7,541,677 B2 | 6/2009 | Kawano | |
| 7,544,605 B2 | 6/2009 | Sparks et al. | |
| 7,772,081 B2 | 8/2010 | Lin et al. | |
| 7,772,116 B2 * | 8/2010 | Akram ............ | H01L 21/76898 438/639 |
| 7,816,227 B2 | 10/2010 | Chen et al. | |
| 7,855,455 B2 | 12/2010 | Purushothaman et al. | |
| 7,863,187 B2 | 1/2011 | Hiatt et al. | |
| 7,915,710 B2 | 3/2011 | Lee et al. | |
| 7,919,835 B2 | 4/2011 | Chen et al. | |
| 7,968,460 B2 | 6/2011 | Kirby et al. | |
| 7,969,016 B2 | 6/2011 | Chen et al. | |
| 7,973,415 B2 | 7/2011 | Kawashita et al. | |
| 7,999,320 B2 | 8/2011 | Botula et al. | |
| 8,026,592 B2 | 9/2011 | Yoon et al. | |
| 8,034,704 B2 | 10/2011 | Komai et al. | |
| 8,058,708 B2 | 11/2011 | Maebashi | |
| 8,097,961 B2 | 1/2012 | Tanaka et al. | |
| 8,097,964 B2 | 1/2012 | West et al. | |
| 8,174,124 B2 | 5/2012 | Chiu et al. | |
| 8,193,092 B2 | 6/2012 | Pratt | |
| 8,247,322 B2 | 8/2012 | Chang et al. | |
| 8,264,077 B2 | 9/2012 | Chiou et al. | |
| 8,294,261 B2 | 10/2012 | Mawatari et al. | |
| 8,399,354 B2 | 3/2013 | Chen | |
| 8,466,059 B2 | 6/2013 | Chang et al. | |
| 8,513,119 B2 | 8/2013 | Chang et al. | |
| 8,513,778 B2 | 8/2013 | Tokitoh | |
| 8,932,906 B2 * | 1/2015 | Wang .................... | H01L 21/187 438/107 |
| 2002/0084513 A1 | 7/2002 | Siniaguine | |
| 2002/0113321 A1 | 8/2002 | Siniaguine | |
| 2002/0182855 A1 | 12/2002 | Argarwala et al. | |
| 2003/0148600 A1 | 8/2003 | Furukawa et al. | |
| 2004/0048459 A1 | 3/2004 | Patti | |
| 2004/0142505 A1 | 7/2004 | Huang et al. | |
| 2004/0188822 A1 | 9/2004 | Hara | |
| 2004/0238927 A1 * | 12/2004 | Miyazawa ........ | H01L 21/76898 257/678 |
| 2004/0245623 A1 * | 12/2004 | Hara et al. ..................... | 257/698 |
| 2004/0248398 A1 | 12/2004 | Ahn et al. | |
| 2005/0194691 A1 | 9/2005 | Sakai et al. | |
| 2005/0200025 A1 | 9/2005 | Casey et al. | |
| 2005/0221601 A1 | 10/2005 | Kawano | |
| 2005/0233581 A1 | 10/2005 | Soejima et al. | |
| 2006/0046468 A1 * | 3/2006 | Akram et al. ................. | 438/637 |
| 2006/0113675 A1 | 6/2006 | Chang et al. | |
| 2006/0273465 A1 | 12/2006 | Tamura | |
| 2006/0289968 A1 | 12/2006 | Sulfridge | |
| 2007/0032061 A1 | 2/2007 | Farnworth et al. | |
| 2007/0045780 A1 * | 3/2007 | Akram ............ | H01L 21/76898 257/621 |
| 2007/0049016 A1 * | 3/2007 | Hiatt ................. | H01L 21/76898 438/667 |
| 2007/0172985 A1 * | 7/2007 | Huang et al. ................. | 438/109 |

(56) References Cited

U.S. PATENT DOCUMENTS

| | | |
|---|---|---|
| 2008/0054444 A1 | 3/2008 | Tuttle |
| 2008/0136023 A1 | 6/2008 | Komai et al. |
| 2008/0211106 A1 | 9/2008 | Chang et al. |
| 2008/0315433 A1 | 12/2008 | Chen et al. |
| 2009/0014843 A1 | 1/2009 | Kawashita et al. |
| 2009/0032960 A1 | 2/2009 | Pratt |
| 2009/0032966 A1 | 2/2009 | Lee et al. |
| 2009/0057909 A1 | 3/2009 | Strothmann |
| 2009/0149023 A1 * | 6/2009 | Koyanagi ........................ 438/666 |
| 2009/0152602 A1 | 6/2009 | Akiyama |
| 2009/0250739 A1 | 10/2009 | Johnson et al. |
| 2009/0269905 A1 | 10/2009 | Chen et al. |
| 2009/0278244 A1 | 11/2009 | Dunne et al. |
| 2009/0283898 A1 * | 11/2009 | Janzen ............... H01L 21/76898 |
| | | 257/698 |
| 2009/0315184 A1 | 12/2009 | Tokitoh |
| 2010/0013060 A1 | 1/2010 | Lamy et al. |
| 2010/0038800 A1 | 2/2010 | Yoon et al. |
| 2010/0078770 A1 | 4/2010 | Purushothaman et al. |
| 2010/0127394 A1 | 5/2010 | Hara et al. |
| 2010/0140805 A1 * | 6/2010 | Chang ................ H01L 21/6835 |
| | | 257/773 |
| 2010/0164117 A1 | 7/2010 | Chen |
| 2010/0171197 A1 | 7/2010 | Chang et al. |
| 2010/0171226 A1 | 7/2010 | West et al. |
| 2010/0176494 A1 | 7/2010 | Chen |
| 2010/0320601 A1 | 12/2010 | Pagaila et al. |
| 2010/0330798 A1 | 12/2010 | Huang et al. |
| 2011/0049706 A1 | 3/2011 | Huang et al. |
| 2011/0068466 A1 | 3/2011 | Chen et al. |
| 2011/0121444 A1 | 5/2011 | Wu et al. |
| 2011/0147916 A1 | 6/2011 | Su |
| 2011/0165776 A1 * | 7/2011 | Hsu ....................... H01L 23/481 |
| | | 438/667 |
| 2011/0186990 A1 | 8/2011 | Mawatari et al. |
| 2011/0204969 A1 | 8/2011 | Chen et al. |
| 2011/0227216 A1 | 9/2011 | Tseng et al. |
| 2011/0233785 A1 | 9/2011 | Koester et al. |
| 2011/0241217 A1 | 10/2011 | Chang et al. |
| 2011/0266691 A1 | 11/2011 | Lin et al. |
| 2011/0318917 A1 | 12/2011 | Yoon et al. |
| 2012/0001337 A1 | 1/2012 | Tsai et al. |
| 2012/0018863 A1 | 1/2012 | Oganesian et al. |
| 2012/0074570 A1 | 3/2012 | Kolb et al. |
| 2012/0086122 A1 | 4/2012 | Cheng et al. |
| 2012/0175774 A1 | 7/2012 | West et al. |
| 2012/0193778 A1 | 8/2012 | Mawatari |
| 2012/0211892 A1 | 8/2012 | Kim et al. |
| 2012/0295437 A1 | 11/2012 | Lu et al. |
| 2012/0313247 A1 | 12/2012 | Yu et al. |
| 2012/0315753 A1 | 12/2012 | Farooq et al. |
| 2013/0001799 A1 | 1/2013 | Chang et al. |
| 2013/0299992 A1 | 11/2013 | Chang et al. |

FOREIGN PATENT DOCUMENTS

| | | |
|---|---|---|
| JP | 2009147218 A | 7/2009 |
| KR | 1020060054688 A | 5/2006 |
| KR | 1020060054689 A | 5/2006 |
| KR | 1020060054690 A | 5/2006 |
| KR | 20080101635 A | 11/2008 |
| KR | 1020080101635 | 11/2008 |
| TW | 531892 A | 5/2003 |
| TW | 200737551 | 10/2007 |
| TW | 200910557 A | 3/2009 |
| TW | 201036106 A | 10/2010 |

* cited by examiner

ISOLATION STRUCTURE FOR STACKED DIES

CROSS-REFERENCE TO RELATED CASES

This application is a divisional of, and claims priority to, U.S. patent application Ser. No. 12/348,622, filed on Jan. 5, 2009 and titled "Isolation Structure for Stacked Dies" which application is incorporated herein by reference.

TECHNICAL FIELD

This disclosure relates generally to integrated circuits and, more particularly, to an isolation structure for stacked dies.

BACKGROUND

Since the invention of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit (IC) formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, a TSV is formed by etching a vertical via through a substrate and filling the via with a conductive material, such as copper. The backside of the substrate is thinned to expose the TSVs, and solder balls are placed directly on the TSVs to provide an electrical contact. Another die is placed on the solder balls, thereby forming a stacked die package.

The dielectric processes used on the circuit side of the substrate are not applicable to the backside due to the thinned substrate. As a result, the backside of the substrate is left unprotected when the solder balls are placed on the exposed TSVs, limiting the wetting surface for the solder ball without forming electrical shorts between the solder ball and the substrate. Furthermore, the structure limits the mechanical strength with the bonding surface and limits the I/O pin population.

Accordingly, there is a need for a better structure and method of bonding to TSV structures.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a method for forming a die having an isolation structure suitable for use in a three-dimensional integrated circuit or stacked die configuration are illustrated in FIGS. 1-5. Throughout the various views and illustrative embodiments of the present invention, like reference numbers are used to designate like elements.

Figure 1:
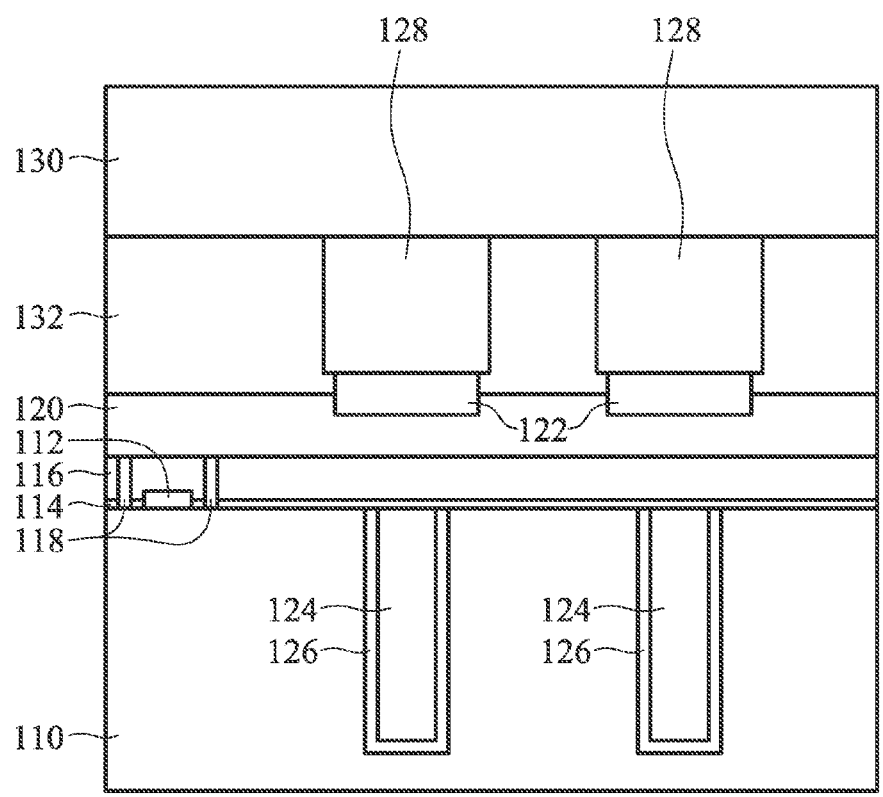
FIGS. 1-5 illustrate intermediate stages in forming a semiconductor device that may be used in a stacked die configuration in accordance with an embodiment of the present invention.

Referring first to FIG. 1, a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 are an etch stop layer 114 and an inter-layer dielectric (ILD) layer 116. The etch stop layer 114 is preferably formed of a dielectric material having a different etch selectivity from adjacent layers, e.g., the underlying semiconductor substrate 110 and the overlying ILD layer 116. In an embodiment, the etch stop layer 114 may be formed of SiN, SiCN, SiCO, CN, combinations thereof, or the like deposited by chemical vapor deposition (CVD) or plasma-enhanced CVD (PECVD) techniques.

The ILD layer 116 may be formed, for example, of a low-K dielectric material, such as silicon oxide, phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof or the like, by any suitable method known in the art, such as spinning, CVD, and PECVD. It should also be noted that the etch stop layer 114 and the ILD layer 116 may each comprise a plurality of dielectric layers, with or without an etch stop layer formed between adjacent dielectric layers.

Contacts 118 are formed through the ILD layer 116 to provide an electrical contact to the electrical circuitry 112. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry to each other and to provide an external electrical connection. The IMD layers 120 are preferably formed of a low-K dielectric material, such as fluorosilicate glass (FSG) formed by PECVD techniques or high-density plasma chemical vapor deposition (HDPCVD) or the like, and may include intermediate etch stop layers, similar to etch stop layer 114. Top metal contacts 122 are provided in the uppermost IMD layer to provide external electrical connections.

Also shown in FIG. 1 are through-silicon vias 124. The through-silicon vias 124 may be formed by any appropriate method. For example, openings may be formed extending into the substrate 110 prior to forming the ILD layer 116 by, for example, one or more etching processes, milling, laser techniques, or the like. The openings are preferably lined with a liner, such as liner 126 that acts as an isolation layer, and filled with a conductive material 124. Preferably, the liner 126 comprises one or more layers of SiN, an oxide, a polymer, or the like, and the conductive material comprises copper, tungsten, aluminum, silver, and combinations thereof, or the like, thereby forming the through-silicon vias 124. Other materials, including conductive diffusion barrier layers, such as TaN, Ta, TiN, Ti, CoW, or the like, may also be used.

It should be noted that the through-silicon vias 124 are illustrated as extending in the substrate 110 from a top surface of the substrate 110 for illustrative purposes only and that other arrangements may be utilized. For example, in another embodiment the through-silicon vias 124 may extend from a top surface of the ILD layer 116 or one of the IMD layers 120. For example, in an embodiment, the through-silicon vias 124 are formed by creating openings extending into the substrate 110 after forming the contacts 118 by, for example, one or more etching process, milling, laser techniques, or the like. The openings are also preferably lined with a liner, such as liner 126, that acts as an isolation layer, and filled with a conductive material as discussed above.

Conductive bumps 128, such as metal bumps formed of Cu, W, CuSn, AuSn, InAu, PbSn, or the like, are formed on the top metal contacts 122, and a carrier substrate 130 is attached to a top surface of the IMD layers 120 using an adhesive 132. Generally, the carrier substrate 130 provides temporary mechanical and structural support during subsequent processing steps. In this manner, damage to the semiconductor substrate 110 is reduced or prevented.

The carrier substrate 130 may comprise, for example, glass, silicon oxide, aluminum oxide, and the like. In an embodiment, an adhesive 132 used to adhere the carrier substrate 130 to a top surface of the IMD 120 (or a passivation layer). The adhesive 132 may be any suitable adhesive, such as an ultraviolet (UV) glue, which loses its adhesive property when exposed to UV lights. The preferred thickness of the carrier substrate 130 is preferably in the range of a few mils to tens of mils.

Figure 2:
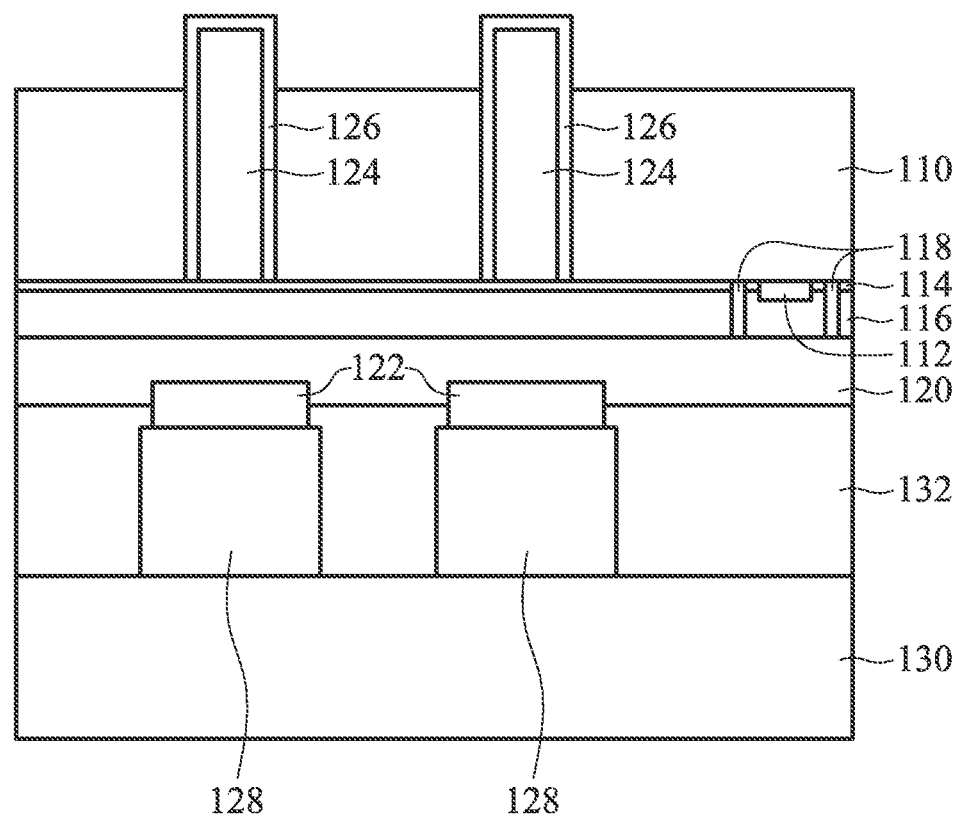
Figure 3:
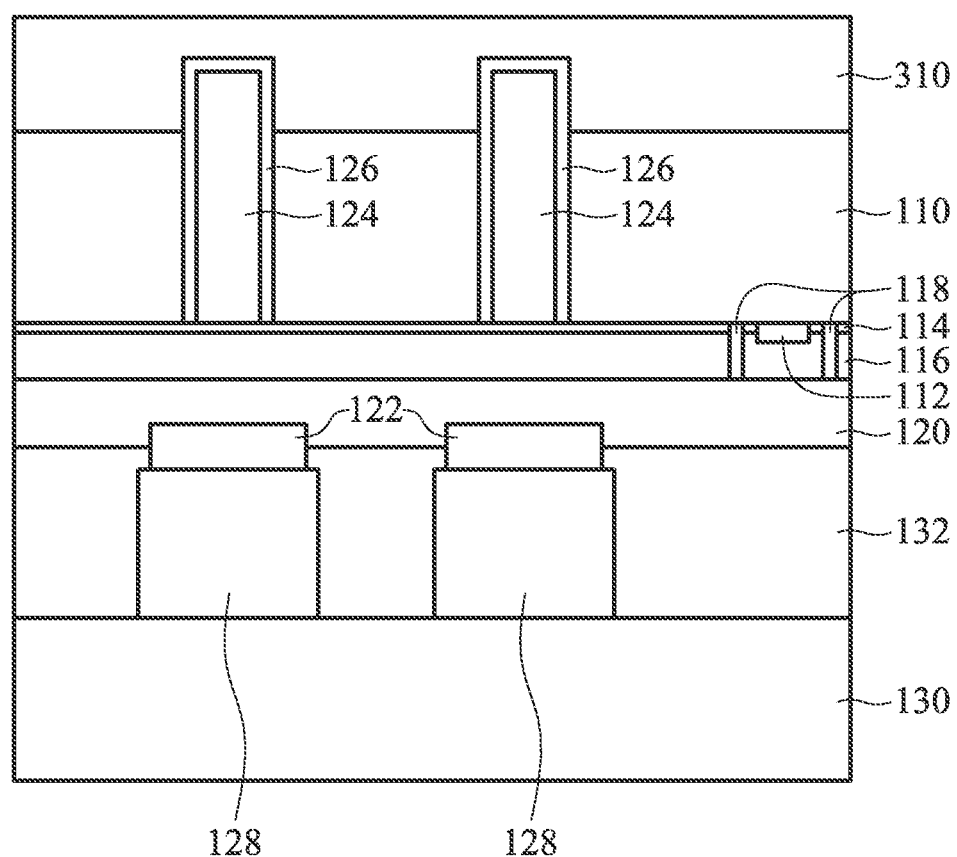

FIG. 2 illustrates a thinning process performed on a backside of the substrate 110 to expose the through-silicon vias 124/liners 126 in accordance with an embodiment of the present invention. The thinning process may be performed using a mechanical grinding process, a chemical mechanical polishing (CMP) process, an etching process, and/or a combination thereof. For example, initially a planarizing process, such as grinding or a CMP, may be performed to initially expose the through-silicon vias 124. Thereafter, a wet or dry etching process having a high etch-rate selectivity between the material of the liners 126 and the material of the substrate 110 may be performed to recess the semiconductor substrate 110, thereby leaving the through-silicon vias 124 and the liners 126 protruding from the underside of the semiconductor substrate 110 as illustrated in FIG. 2. In an embodiment in which the through-silicon vias 124 are formed of copper and the liners 126 are formed of an oxide, the semiconductor substrate 110 may be recessed by, for example, performing a dry etch process using HBr/O2, HBr/Cl2/O2, SF6/CL2, SF6 plasma, or the like. Preferably, the through-silicon vias 124 and the liners 126 are exposed in the range of about sub-μm to about few μms FIG. 3 illustrates an isolation film 310 formed over the backside of the substrate 110 (or a native oxide that may be formed on the surface of the substrate 110) in accordance with an embodiment of the present invention. In a preferred embodiment, the isolation film 310 is a dielectric material, such as SiN, an oxide, SiC, SiON, a polymer, or the like, and may be formed by, for example, spin-coating, printing, a CVD process, or the like. Preferably, the isolation film 310 is formed using a low-temperature process, e.g., using temperatures less than 250° C. by a PECVD process, preventing the bonding adhesive from degrading to ensure the mechanical strength throughout the integration process. The isolation film 310 is preferably formed having a thickness sufficient to cover the exposed through-silicon vias 124.

Depending on the process utilized to form the isolation film 310, it may be desirable to perform a planarization process. In particular, some methods of deposition, such as spin-coating, create a planar surface, but other methods, such as a CVD process, form a conformal layer and as a result, it may be desirable to perform a planarization process, such as a grinding or CMP process, to create a planar surface as illustrated in FIG. 3.

Figure 4:
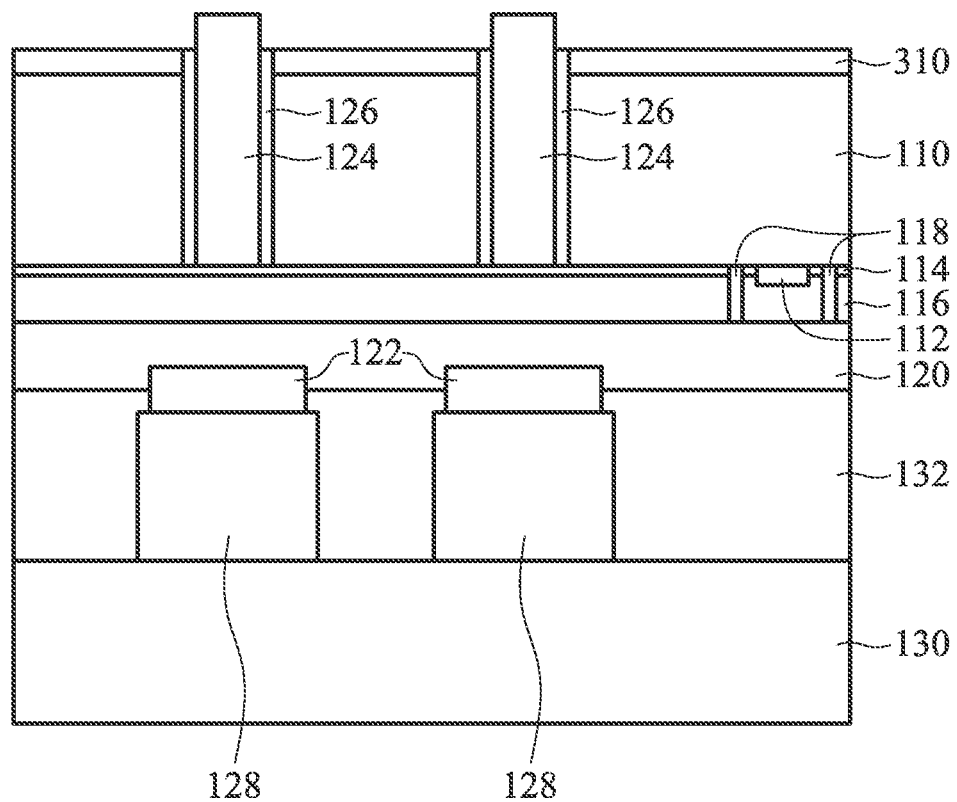

FIG. 4 illustrates a second exposure of the through-silicon vias 124 in accordance with an embodiment of the present invention. The thinning process may be performed using a mechanical grinding process, a CMP process, an etching process, and/or a combination thereof. For example, initially a planarizing process, such as grinding or a CMP, may be performed to initially expose the through-silicon vias 124. Thereafter, a wet or dry etching process having a high etch-rate selectivity between the material of the through-silicon vias 124 and the liners 126 and the material of the isolation film 310 may be performed to recess the isolation film 310, thereby leaving the through-silicon vias 124 protruding from the underside of the isolation film 310 as illustrated in FIG. 4. In an embodiment in which the through-silicon vias 124 are formed of copper, the isolation film 310 may be recessed by performing a wet etch using hydrofluoric acid or a dry etching process. Other processes and materials may be used. Preferably, the through-silicon vias 124 are exposed in the range of about sub-μm to about a few μms.

FIG. 4 also illustrates removing the liners 126 from the exposed portions of the through-silicon vias 124 along with the recess step of the isolation film 310.

Figure 5:
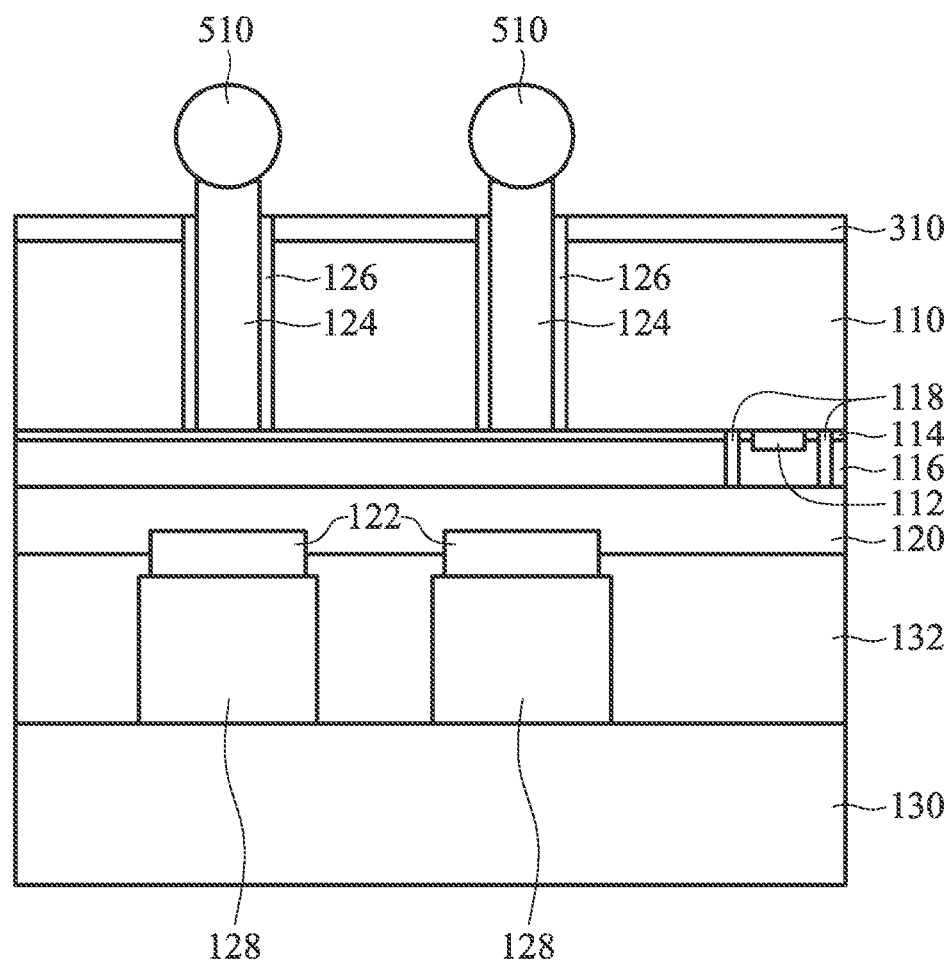

As illustrated in FIG. 5, connection elements 510 are formed on the exposed through-silicon vias 124 in accordance with an embodiment of the present invention. The connection elements 510 may be any suitable conductive material, such as Cu, Ni, Sn, Au, Ag, or the like, and may be formed by any suitable method, including evaporation, electroplating, printing, jetting, stud bumping, direct placement, or the like.

Thereafter, other back-end-of-line (BEOL) processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

Figure 6:
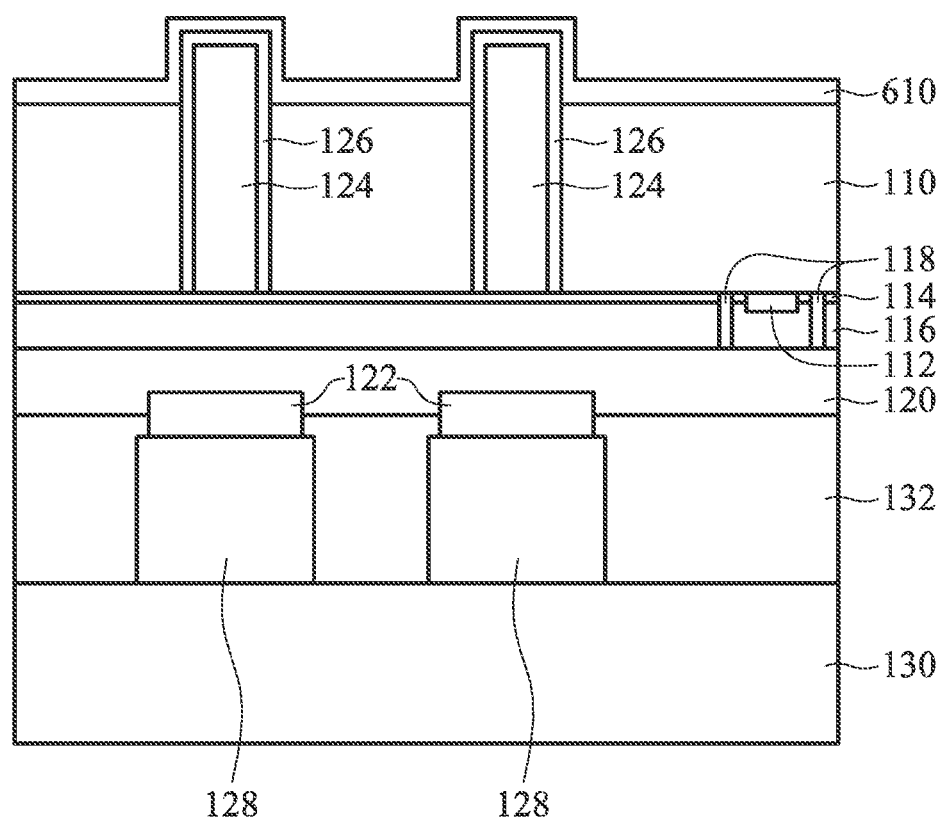
FIGS. 6-11 illustrate intermediate stages in forming a semiconductor device that may be used in a stacked die configuration in accordance with another embodiment of the present invention.

FIGS. 6-11 illustrate another method of forming an isolation structure on a die suitable for a stacked die configuration in accordance with an embodiment of the present invention. The method illustrated in FIGS. 6-11 assumes a starting configuration such as that illustrated in FIG. 2 discussed above, wherein like reference numerals refer to like elements FIG. 6 illustrates an isolation film 610 formed over the backside of the substrate 110 (or a native oxide that may be formed on the surface of the substrate 110) in accordance with an embodiment of the present invention. In a preferred embodiment, the isolation film 610 is a conformal layer of a dielectric material, such as SiN, an oxide, SiC, SiON, a polymer, or the like, and may be formed by, for example, a CVD process, a PECVD process, or the like. Preferably, the isolation film 610 is formed using a low-temperature process, e.g., using temperatures less than 250° C. with a PECVD process, preventing the bonding adhesive from degrading to ensure the mechanical strength throughout the integration process. The isolation film 610 is preferably formed having a thickness of several kÅ. It should be noted, however, that the thickness of the isolation film 610 is less than the amount by which the through-silicon vias 124 protrude from the substrate 110.

Figure 7:
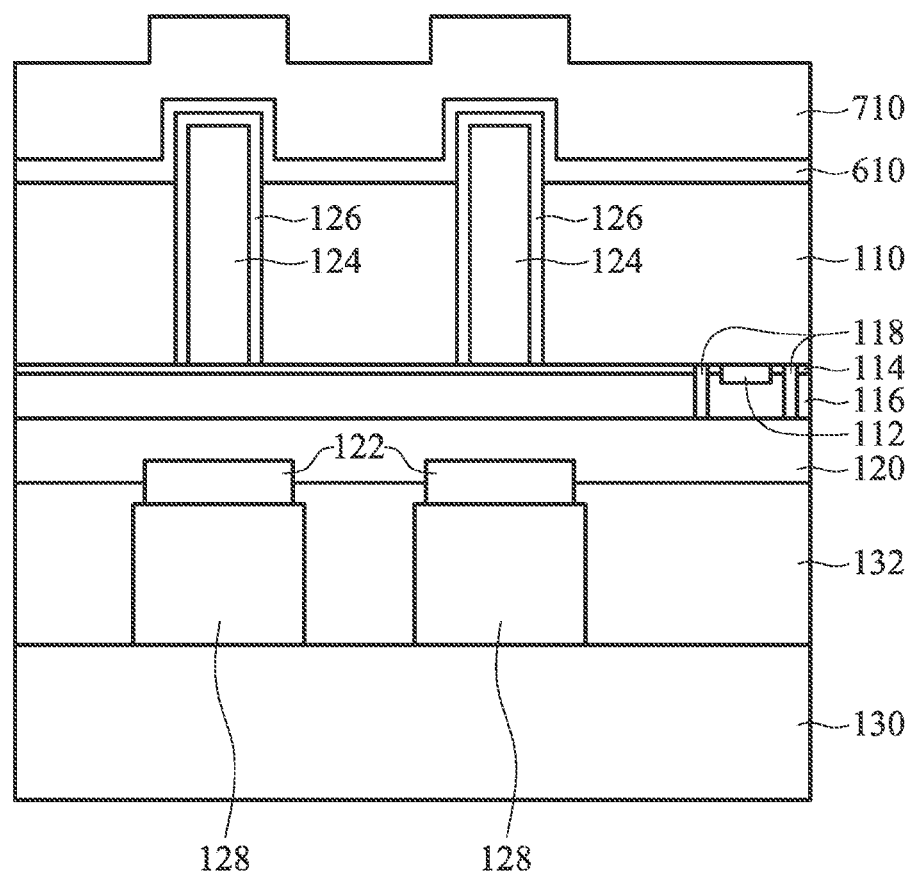
Figure 8:
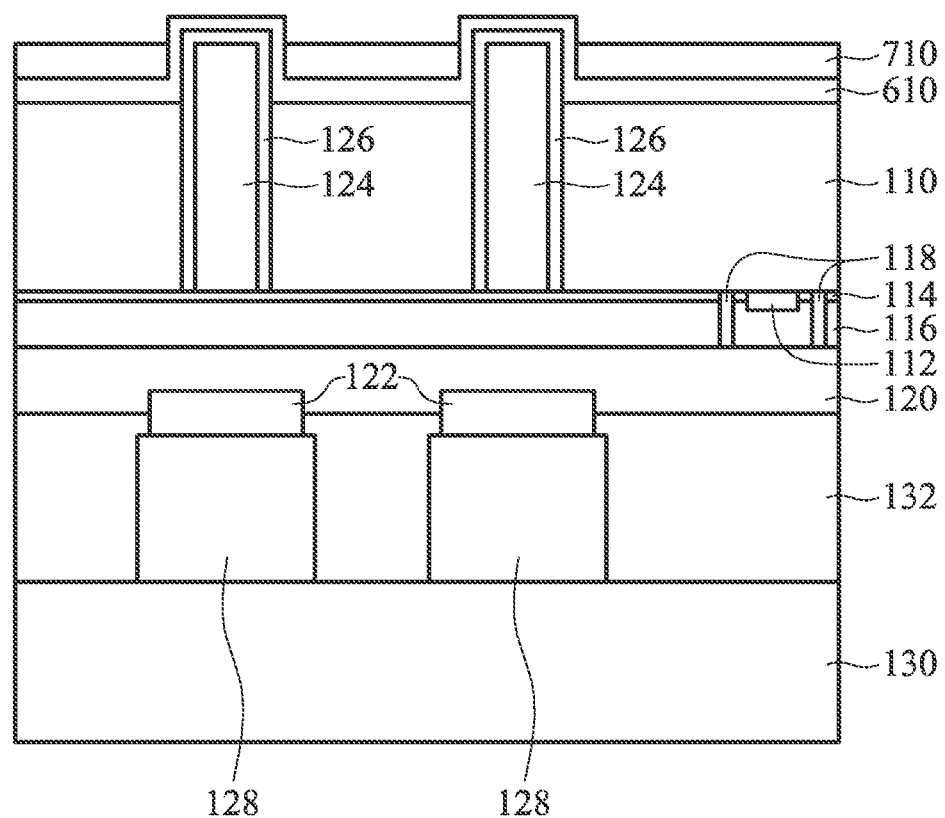

FIG. 7 illustrates a mask layer 710 formed over the isolation film 610, and FIG. 8 illustrates an etch-back process to expose the isolation film 610 over the through-silicon vias 124 in accordance with an embodiment of the present invention. In an embodiment, the mask layer 710 comprises a photoresist material, although other materials having a high-etch selectivity with the underlying isolation film 610 and the liner 126 may be used. The etch-back process may be performed by, for example, dry etching process.

Figure 9:
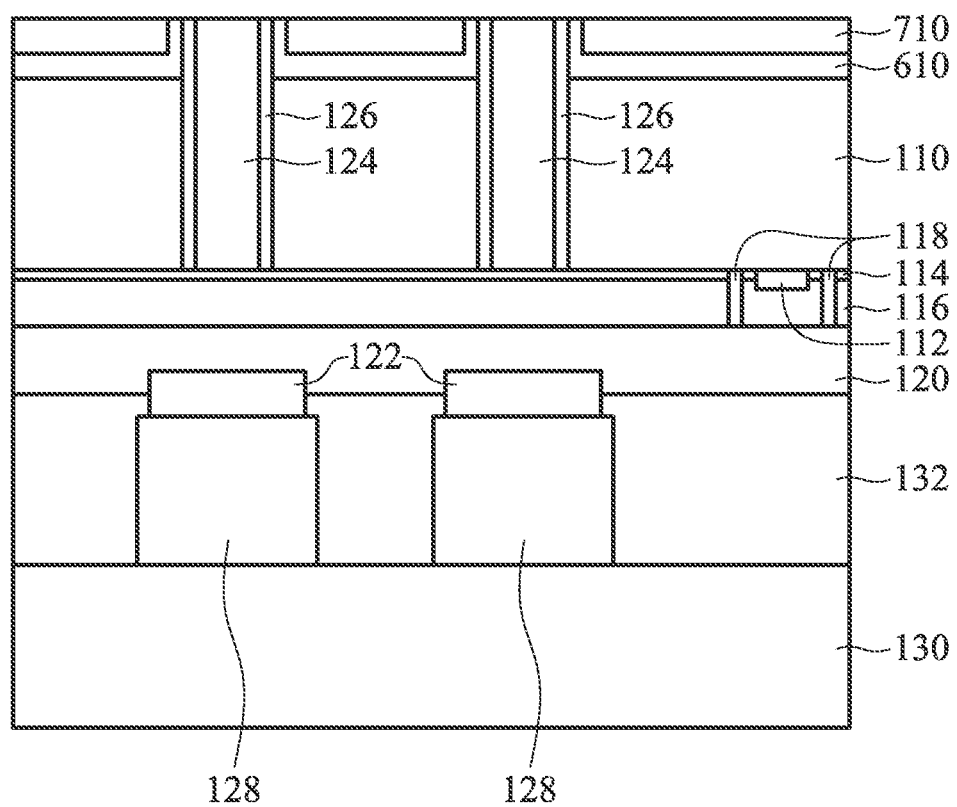

Thereafter, as illustrated in FIG. 9, the liner 126 and the isolation film 610 positioned on the through-silicon vias 124 are removed, thereby exposing the through-silicon vias 124. A wet or dry etching process having a high etch-rate selectivity between the material of the mask layer 710 and the material of the through-silicon vias 124, the liners 126, and the isolation film 610 may be performed to remove a portion of the isolation film 610 and the liners 126, thereby exposing the through-silicon vias 124 as illustrated in FIG. 9. In an embodiment in which the through-silicon vias 124 are formed of copper, exposing the through-silicon vias 124 may be performed by, for example, a wet etch using hydrofluoric acid or a dry etch process. Other processes and materials may be used.

Figure 10:
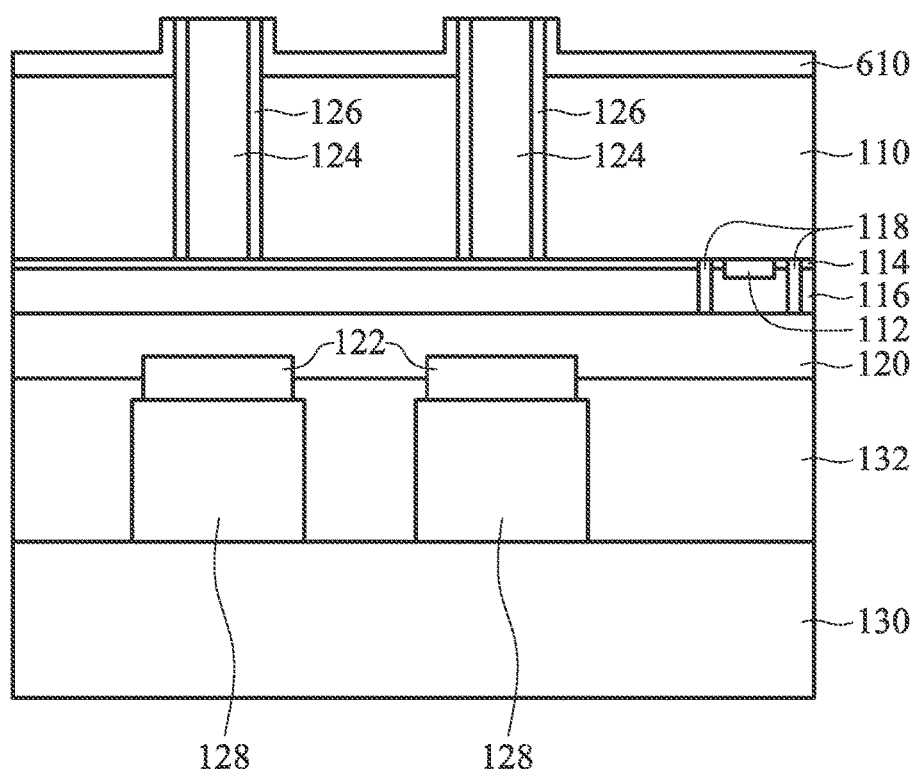

FIG. 10 illustrates the removal of the mask layer 710 (see FIG. 7) in accordance with an embodiment of the present invention. In an embodiment in which the patterned mask 710 is a photoresist mask, a plasma ashing or a wet strip process may be used to remove the patterned mask 710. One preferred plasma ashing process uses an O2 flow rate of about 1000 sccm to about 2000 sccm at a pressure of about 300 mTorr to about 600 mTorr and at power of about 500 Watts to about 2000 Watts and at a temperature of about 80° C. to about 200° C., for example. Optionally, the plasma ashing process may be followed by a wet dip in a solvent chemical to clean the wafer and remove any remaining photoresist material.

Figure 11:
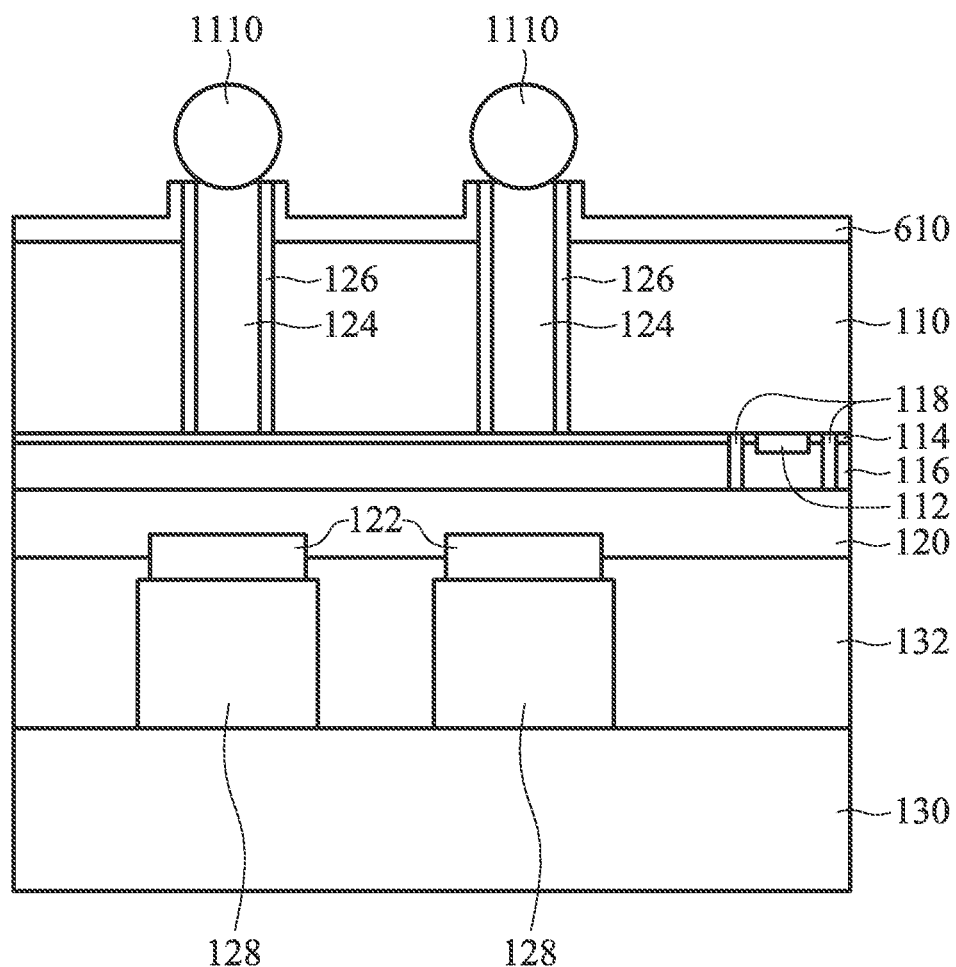

As illustrated in FIG. 11, connection elements 1110 are formed on the exposed through-silicon vias 124 in accordance with an embodiment of the present invention. The connection elements 1110 may be any suitable conductive material, such as Cu, Ni, Sn, Au, Ag, or the like, and may be formed by any suitable method, including evaporation, electroplating, printing, jetting, stud bumping, direct placement, or the like.

Thereafter, other back-end-of-line (BEOL) processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

FIGS. 12-16 illustrate another method of forming an isolation structure on a die suitable for a stacked die configuration in accordance with another embodiment of the present invention. The method illustrated in FIGS. 12-16 assumes a starting configuration such as that illustrated in FIG. 4 discussed above, wherein like reference numerals refer to like elements.

Figure 12:
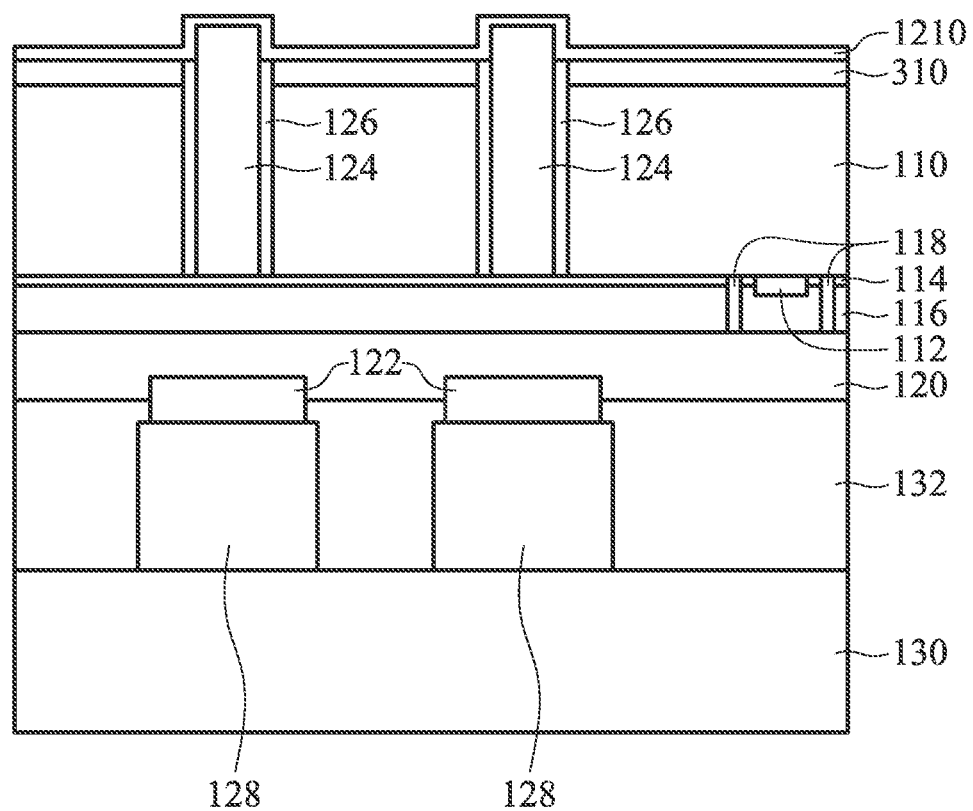
FIGS. 12-16 illustrate intermediate stages in forming a semiconductor device that may be used in a stacked die configuration in accordance with another embodiment of the present invention.

Referring now to FIG. 12, a conformal seed layer 1210 is deposited over the surface of the isolation film 310 and the exposed portions of the through-silicon vias 124. The seed layer 1210 is a thin layer of a conductive material that aids in the formation of a thicker layer during subsequent processing steps. In an embodiment, the seed layer 1210 may be formed by depositing a thin conductive layer, such as a thin layer of Cu, Ti, Ta, TiN, TaN, or the like, using CVD or PVD techniques. For example, a layer of Ti is deposited by PVD process to form a barrier film and a layer of Cu is deposited by PVD process to form a seed layer.

Figure 13:
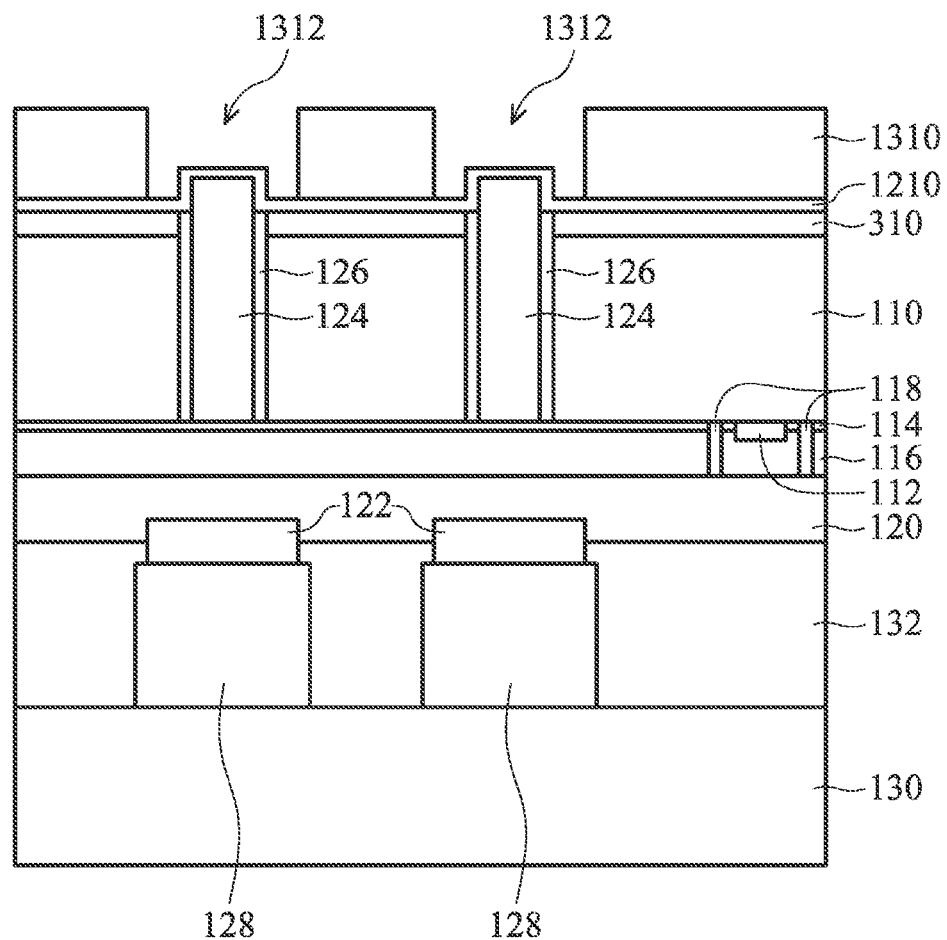

FIG. 13 illustrates a patterned mask 1310 formed over the seed layer 1210 in accordance with an embodiment of the present invention. The patterned mask 1310 preferably comprises a pattern photoresist, hard mask, or the like. In a preferred embodiment, a photoresist material is deposited and patterned to form openings 1312 over the through-silicon vias 124.

Figure 14:
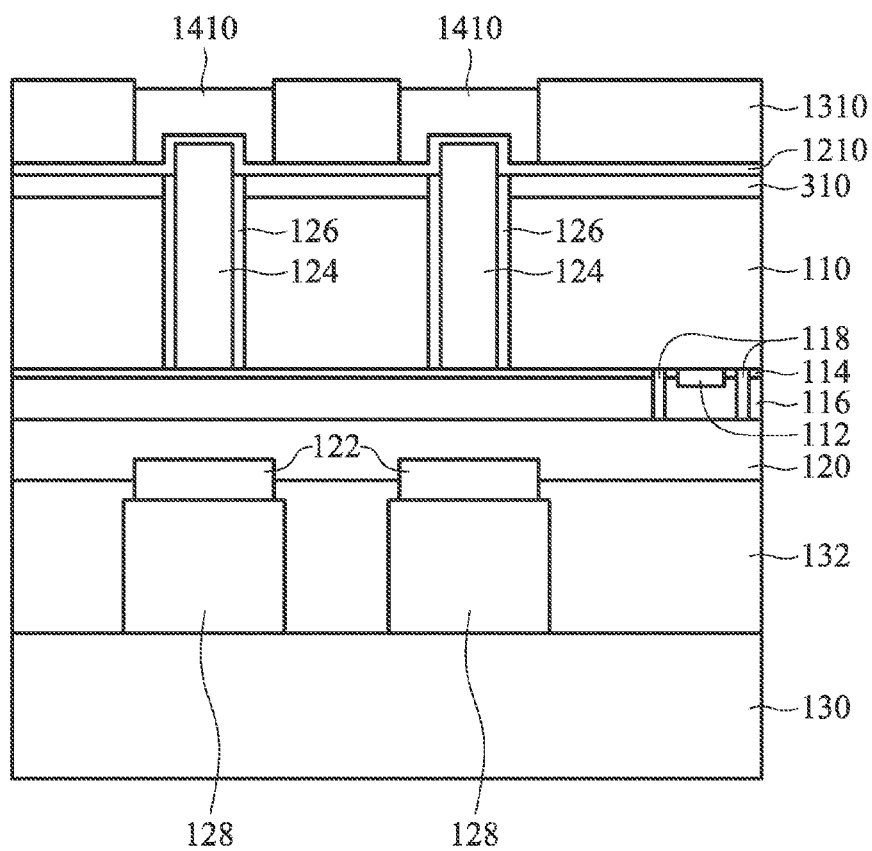

Thereafter, conductive pads 1410 are formed in the openings 1312 as illustrated in FIG. 14. The conductive pads 1410 may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., the openings 1410.

Figure 15:
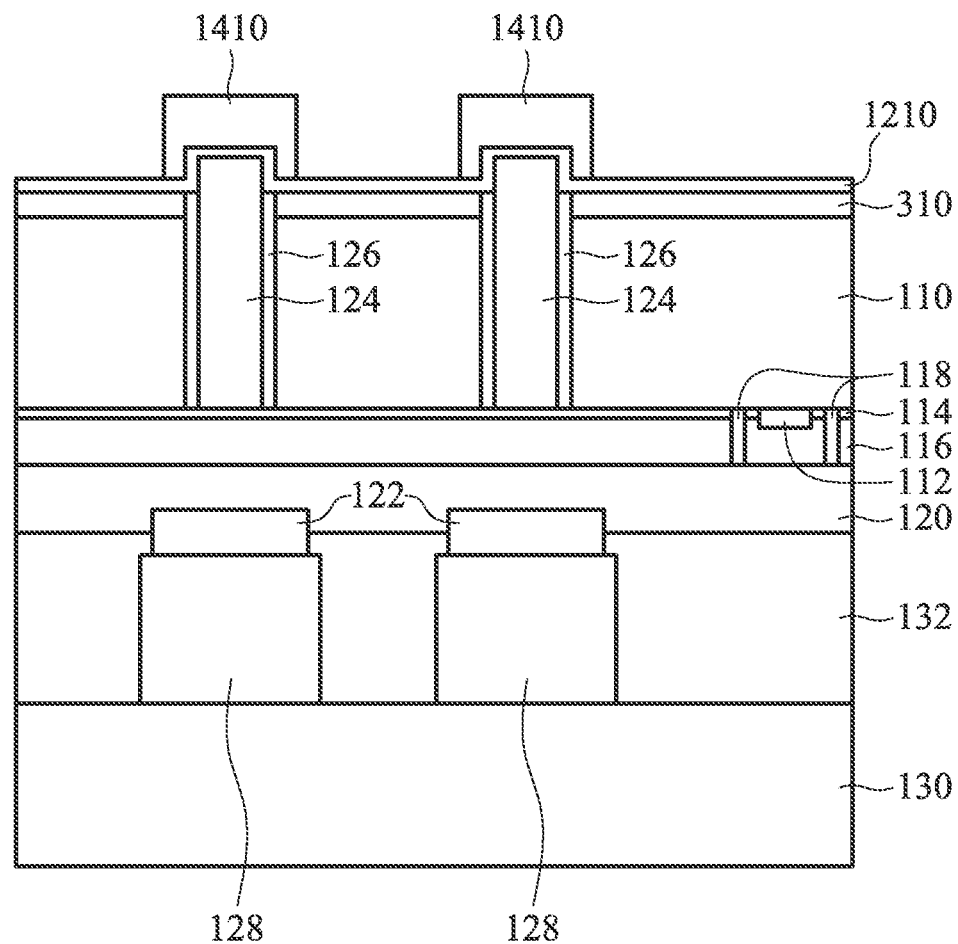

FIG. 15 illustrates the removal of the patterned mask 1310 (see FIG. 13) in accordance with an embodiment of the present invention. In an embodiment in which the patterned mask 1310 is a photoresist mask, a plasma ashing or a wet strip process may be used to remove the patterned mask 1310 as discussed above.

Figure 16:
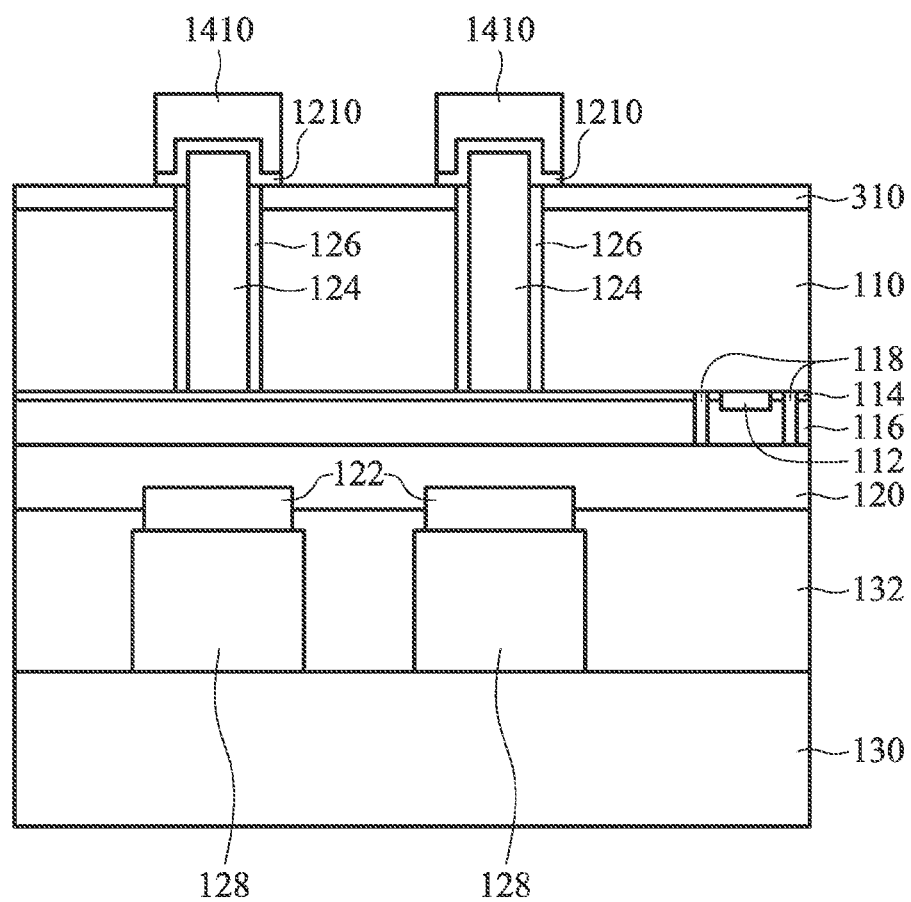

FIG. 16 illustrates removal of the exposed seed layer 1210. The seed layer 1210 may be removed by, for example, a wet etching process.

Thereafter, other BEOL processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

FIGS. 17-21 illustrate another method of forming an isolation structure on a die suitable for a stacked die configuration in accordance with another embodiment of the present invention. The method illustrated in FIGS. 17-21 assumes a starting configuration such as that illustrated in FIG. 10 discussed above, wherein like reference numerals refer to like elements.

Figure 17:
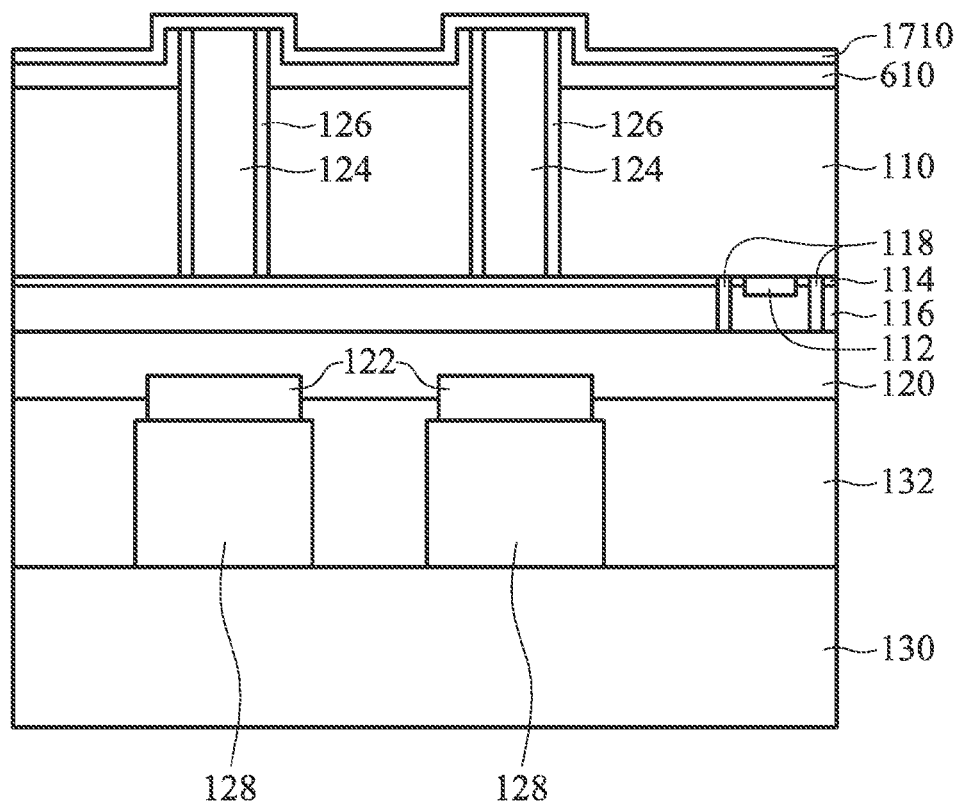
FIGS. 17-21 illustrate intermediate stages in forming a semiconductor device that may be used in a stacked die configuration in accordance with yet another embodiment of the present invention.

Referring first to FIG. 17, a conformal seed layer 1710 is deposited over the surface of the isolation film 610 and the exposed portions of the through-silicon vias 124. The seed layer 1710 is a thin layer of a conductive material that aids in the formation of a thicker layer during subsequent processing steps and may include a barrier film. The seed layer 1710 may be formed using similar materials and similar processes as the seed layer 1210 discussed above with reference to FIG. 12.

Figure 18:
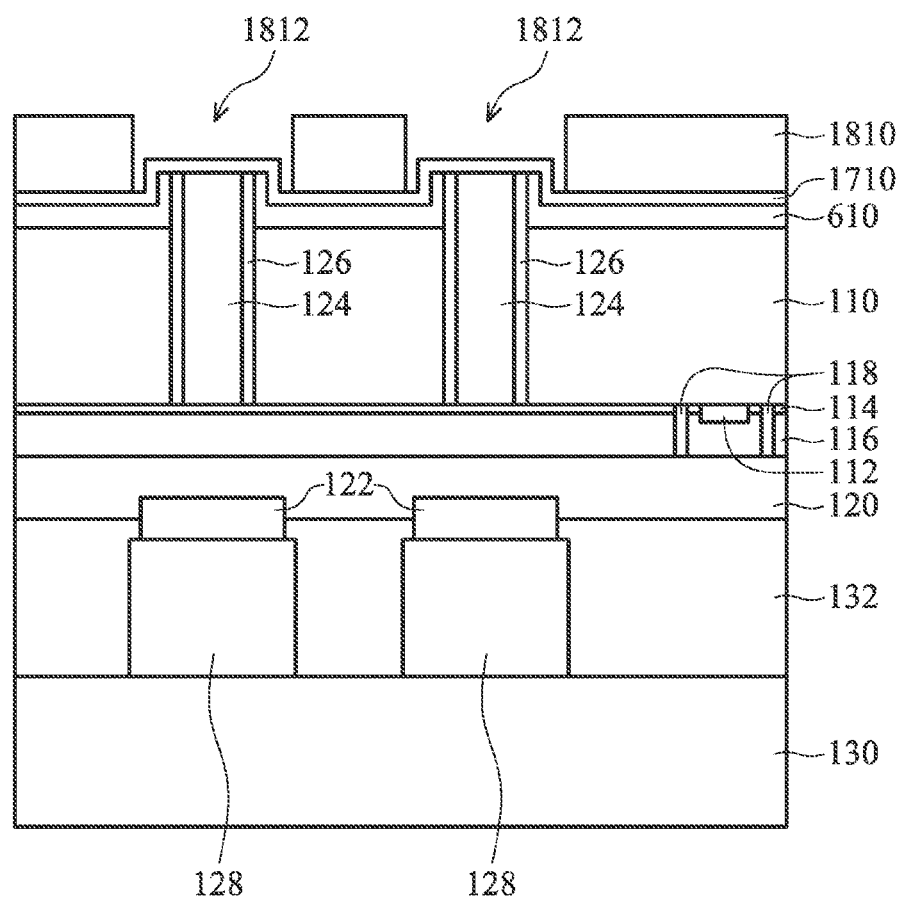

FIG. 18 illustrates a patterned mask 1810 formed over the seed layer 1710 in accordance with an embodiment of the present invention. The patterned mask 1810 preferably comprises a pattern photoresist, hard mask, or the like. In a preferred embodiment, a photoresist material is deposited and patterned to form openings 1812 over the through-silicon vias 124.

Figure 19:
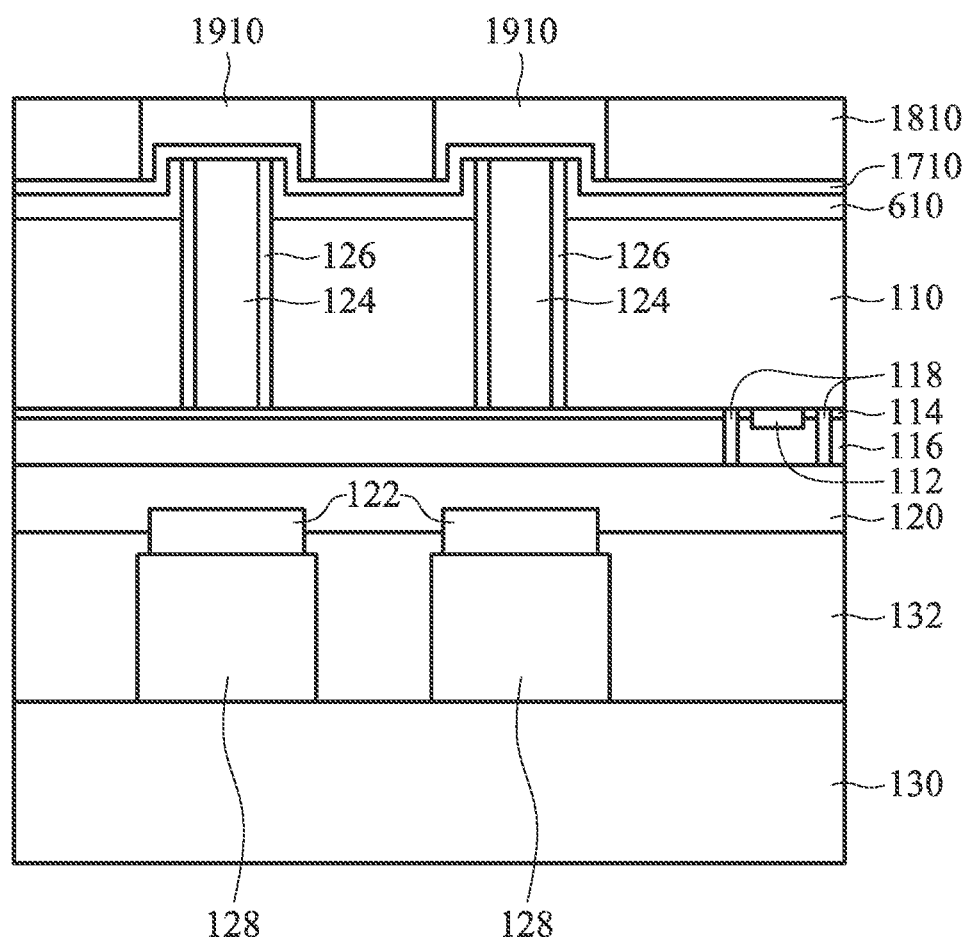

Thereafter, conductive pads 1910 are formed in the openings 1812 as illustrated in FIG. 19. The conductive pads 1910 may be formed, for example, by electroplating, electroless plating, or the like as discussed above with reference to conductive pads 1410 (see FIG. 14).

Figure 20:
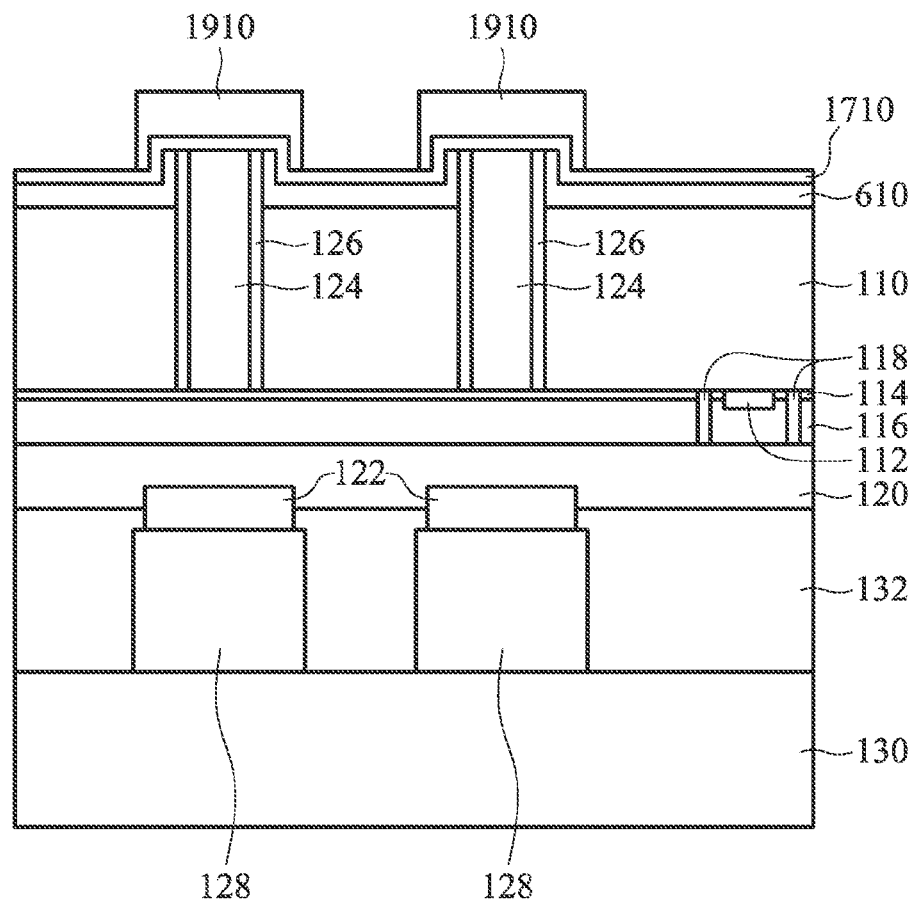

FIG. 20 illustrates the removal of the patterned mask 1810 (see FIG. 18) in accordance with an embodiment of the present invention. In an embodiment in which the patterned mask 1810 is a photoresist mask, a plasma ashing or a wet strip process may be used to remove the patterned mask 1810. Optionally, the plasma ashing process may be followed by a wet dip in a solvent chemical to clean the wafer and remove remaining photoresist material.

Figure 21:
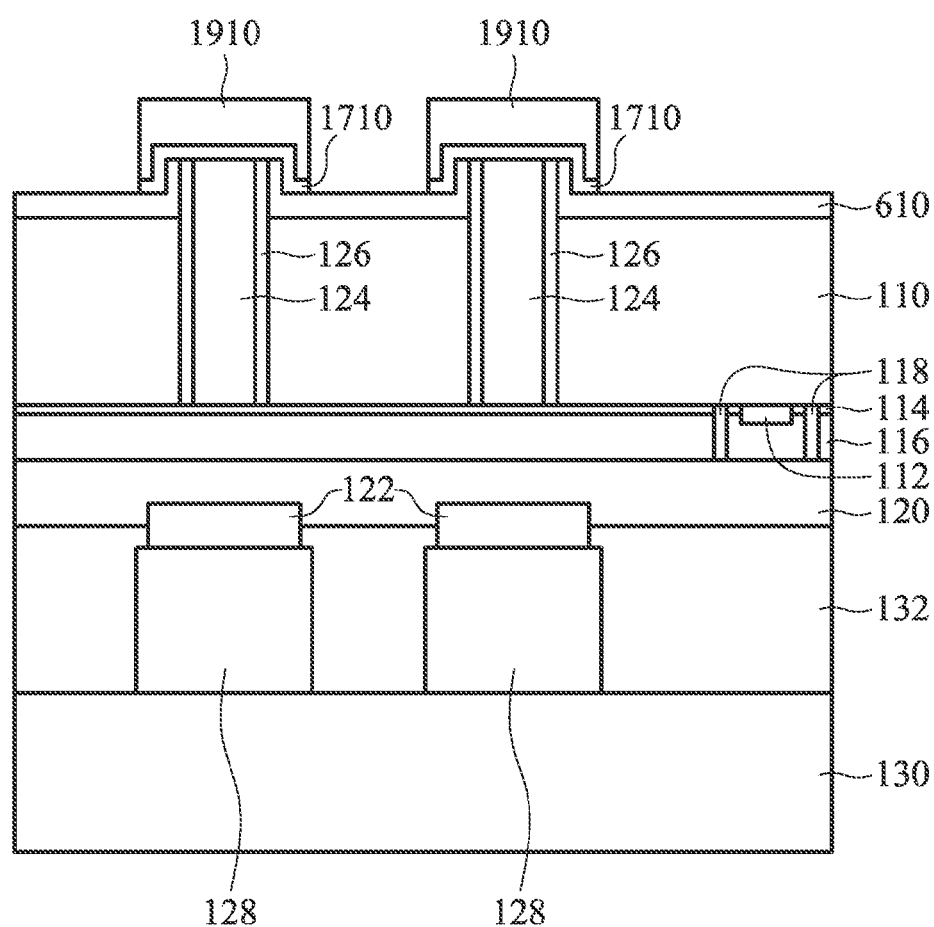

FIG. 21 illustrates removal of the exposed seed layer 1710. The seed layer 1710 may be removed by, for example, a wet etching process.

Thereafter, other BEOL processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

In accordance with an embodiment of the present invention, a semiconductor device is provided. The semiconductor device has a semiconductor substrate with through-silicon vias extending through and a portion thereof protruding from the backside of the semiconductor substrate. An isolation film is formed on the backside of the semiconductor substrate between adjacent protruding portions of the through-silicon vias. The isolation film does not extend beyond the protruding portions of the through-silicon vias. Conductive elements, such as solder balls or metal pads, are formed over the exposed through-silicon vias.

In accordance with another embodiment of the present invention, a method of forming a semiconductor device is provided. The method includes providing a semiconductor substrate having a through-silicon via extending from a circuit side partially through the semiconductor substrate. A backside of the semiconductor substrate is thinned such that the through-silicon via protrudes from the backside of the semiconductor substrate. An isolation film is formed over the backside of the semiconductor substrate and the through-silicon via, and then the isolation film is thinned such that the through-silicon via is exposed. A conductive element, such as a solder ball or a metal pad, is formed over the exposed through-silicon via.

In accordance with yet another embodiment of the present invention, another method of forming a semiconductor device is provided. The method includes providing a semiconductor substrate having a first side and a second side opposite the first side. The semiconductor substrate has a through-silicon via extending from a first side partially through the semiconductor substrate. The through-silicon via is exposed such that at least a portion of the through-silicon via protrudes from the second side of the semiconductor substrate, and a dielectric layer is formed over the second side of the semiconductor substrate. A patterned mask is formed over the dielectric layer such that the dielectric layer over the through-silicon via is exposed. The exposed portions of the dielectric layer are removed, thereby exposing the through-silicon via.

It should be appreciated that embodiments of the present invention discussed above provide an isolation structure around the exposed through-silicon vias, thereby providing a larger wetting surface for forming the solder balls with reduced or no concern for shorting the solder ball to the substrate. As a result, the density of the solder balls may be increased. Furthermore, the addition of the isolation film increases the mechanical strength of the bonding interface.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a substrate having an opening formed therein, the opening having sidewalls extending from a circuit side of the substrate to a backside of the substrate;
   a through via formed of conductive material disposed in the opening, wherein the through via has a first side and second, opposing side, the second side extending beyond the backside of the substrate, wherein the through via has sidewalls extending between the first and second side, wherein the sidewalls are substantially straight between the first side and second side;
   a liner layer disposed on at least a portion of the sidewalls of the opening adjacent the through via;
   an isolation film disposed over the backside of the substrate, wherein a topmost surface of the liner layer and a topmost surface of the isolation film are level with the second side of the through via;
   a conductive cap layer over the second side of the through via, the conductive cap layer having a substantially flat upper surface, the conductive cap layer being a non-conformal layer; and
   a solder material directly disposed on at least a portion of the flat upper surface of the conductive cap layer.

2. The device of claim 1, further comprising:
   one or more intermetal dielectric (IMD) layers disposed on the circuit side of the substrate;
   metal contacts disposed over the circuit side of the substrate in an uppermost one of the one or more IMD layers; and
   conductive bumps disposed on the metal contacts.

3. The device of claim 1, further comprising:
   an active device formed on the circuit side of the substrate; and
   a metallization layer disposed on the circuit side of the substrate and connecting a first end of the through via at the circuit side of the substrate to the active device.

4. The device of claim 1 further comprising:
   an etch stop layer on the circuit side of the substrate, wherein the through via extends through the etch stop layer; and
   electrical circuitry extending from the circuit side of the substrate.

5. The device of claim 1, wherein the isolation film and the liner layer are the same material.

6. The device of claim 1, wherein a bottommost surface of the solder material is separated from a surface of the isolation film and a surface of the liner layer.

7. A semiconductor device, comprising:
   a substrate having a first side and a second side opposite the first side and an opening extending through the substrate from the first side to the second side;
   a liner layer disposed directly on a surface of the opening;
   a conductive through via formed on the liner layer and filling the opening, the conductive through via having at least a portion of the through via protruding from the second side of the substrate;
   a dielectric layer over the second side of the substrate, the dielectric layer having a first surface in contact with the substrate and having a second surface opposite the first surface, wherein the dielectric layer and the liner layer are the same material;
   a conductive pad disposed on the second side of the substrate and on the conductive through via, the conductive pad having substantially straight sidewalls that are substantially perpendicular to a surface of the second side of the substrate, wherein at least a portion of the dielectric layer is disposed between the conductive through via and the conductive pad along a line parallel to the surface of the second side of the substrate, wherein the conductive pad is a non-conformal layer, wherein the conductive pad comprises copper;
   circuitry on the first side of the substrate; and
   an etch stop layer disposed on the first side of the substrate, the etch stop layer adjacent to the circuitry.

8. The semiconductor device of claim 7, wherein the conductive pad has a substantially flat top surface.

9. The semiconductor device of Claim 8, wherein the conductive pad comprises copper throughout.

10. The semiconductor device of claim 7, wherein the second surface of the dielectric layer is non-planar.

11. The semiconductor device of claim 7, wherein at least a portion of the liner layer is disposed between the conductive through via and the dielectric layer.

12. The semiconductor device of claim 7, further comprising a seed layer interposed between the conductive pad and the through via.

13. The semiconductor device of claim 7, further comprising a flowable material disposed directly on the conductive pad.

14. A semiconductor device, comprising:
   a substrate having an opening extending from a circuit side through the substrate to a backside of the substrate;

a passivation layer having a first surface on the backside of the substrate and having a second surface opposite the first surface;

a liner layer directly on a surface of the opening, wherein the passivation layer and the liner layer are the same material;

a through via on the liner layer and filling the opening, a portion of the through via exposed through the liner layer;

a conductive pillar disposed on the backside of the substrate and on the through via, the conductive pillar being a non-conformal layer having substantially straight sidewalls that are substantially perpendicular to a surface of the backside of the substrate, wherein at least a portion of the passivation layer is disposed between the through via and the conductive pillar along a line parallel to the surface of the backside of the substrate, wherein the conductive pillar continuously contacts the passivation layer from outermost extents of the conductive pillar to the through via, wherein the conductive pillar comprises copper;

one or more intermetal dielectric (IMD) layers disposed on the circuit side of the substrate;

metal contacts disposed over the circuit side in an uppermost IMD layer of the one or more IMD layers; and conductive bumps disposed over the uppermost IMD layer and on the metal contacts.

15. The semiconductor device of claim 14, wherein at least one of the IMD layers covers a first end of the through via, and wherein a metallization layer disposed in the one or more IMD layers connects the first end of the through via to an active device formed on the circuit side of the substrate.

16. The semiconductor device of claim 15, wherein a lowermost surface of the through via is disposed between the metallization layer and the substrate.

17. The semiconductor device of claim 14 further comprising an etch stop layer on the circuit side of the substrate, wherein the through via extends through the etch stop layer.

18. The semiconductor device of claim 14, wherein an upper surface of the passivation layer is non-planar.

19. The semiconductor device of claim 14, wherein the conductive pillar comprises a conductive pad over a seed layer.

20. The semiconductor device of claim 14, wherein the conductive pillar has a substantially flat top surface.

21. The semiconductor device of Claim 14, further comprising a flowable material directly on the conductive pillar.

* * * * *